US006750681B2

(12) United States Patent
Wei

(10) Patent No.: US 6,750,681 B2
(45) Date of Patent: Jun. 15, 2004

(54) HIGH SPEED CURRENT MODE LOGIC GATE CIRCUIT ARCHITECTURE

(75) Inventor: James Wei, Kitchener (CA)

(73) Assignee: SiRiFIC Wireless Corporation, Waterloo (CA)

( * ) Notice: Subject to any disclaimer, the term of this patent is extended or adjusted under 35 U.S.C. 154(b) by 0 days.

(21) Appl. No.: 10/229,660

(22) Filed: Aug. 27, 2002

(65) Prior Publication Data

US 2004/0041592 A1 Mar. 4, 2004

(51) Int. Cl.$^7$ ............................................. H03K 19/20
(52) U.S. Cl. ..................... 326/127; 326/126; 326/115; 326/104
(58) Field of Search ................................ 326/127, 115, 326/104, 106, 108, 30, 126; 327/355, 356, 359

(56) References Cited

U.S. PATENT DOCUMENTS 6,414,519 B1 * 7/2002 Abernathy ................. 326/127
6,489,811 B2 * 12/2002 Jenkins ....................... 326/115

* cited by examiner

Primary Examiner—Vibol Tan
(74) Attorney, Agent, or Firm—Gardner Groff, P.C.

(57) ABSTRACT

An integrated circuit logic topology or architecture suitable for low voltage differential logic operating at radio frequencies is disclosed. The topology, referred to as enhanced pseudo common mode logic, is similar to and compatible with traditional CML, and provides the additional advantage of eliminating the need for level conversion between consecutive logic gates, thereby increasing the potential maximum operating frequency of subsystems implemented using the invention. The invention retains most of the advantages of traditional CML, and in addition permits the independent selection of output logic high level and output logic low level so that they may be matched with the succeeding circuit input levels.

13 Claims, 5 Drawing Sheets

HIGH SPEED CURRENT MODE LOGIC GATE CIRCUIT ARCHITECTURE

FIELD OF THE INVENTION

The invention is in the domain of source-coupled logic implemented in large scale integrated (LSI) radio frequency technology.

BACKGROUND OF THE INVENTION

Metal Oxide Silicon (MOS) Current Mode Logic (CML), (sometimes known as Common Mode Logic), has several interesting properties that make it desirable for low power and high performance designs. First, the circuits operate with a small voltage swing, typically in the order of 0.2 to 0.4 Volts. This decreased voltage swing permits much faster switching although it may decrease the robustness of the circuit with respect to noise margins. CML gates also draw a relatively constant amount of current from the power supply, a property that significantly reduces the amount of noise (in the form of spikes) on the supply and substrate voltages. This reduction in noise is extremely desirable in mixed signal environments where the analog circuitry is especially susceptible to switching noise from the digital logic. Another beneficial property of CML circuits is that they are differential in nature, which provides good noise immunity to common-mode signals such as supply bounce.

In existing integrated circuits designed using Current Mode Logic (CML) technology, the problem of adjusting the output voltage levels of preceding gates to the voltage input levels expected in the succeeding gates is well-known. In many designs the approach taken is to introduce level-shifting (active) devices (transistor buffers) which achieve the objective of adjusting the level, but do so at the cost of extra power consumption and increased propagation delay. The overall effect is to reduce the maximum operating frequency achievable for a given design and technology. Other approaches include the use of passive level shifters, that is a network of resistors and capacitors, which have similar shortcomings. A further solution sometimes seen is to alternate the logic (negative/positive) so that the logic input levels of stages following may be chosen to match the output levels of the preceding stage, and the circuit adapted to produce the desired logical effect. However, the logic levels are not consistent across the whole circuit or system, and this solution can cause some confusion during design, since the logic input levels required for a given stage and the logic itself needs to be designed carefully, in some cases requiring a further stage of logic. Any extra stages of logic result in increased propagation delays.

By way of an example, in prior art implementations, the input levels and output levels may be implied from the exemplary circuit as shown in FIG. 1, which shows a complementary two-input AND gate, symbolically 180, and schematically, 190. A similar immediately succeeding stage or gate using this design could not have complementary inputs such as A and $\overline{A}$ being fed from the complementary outputs C and $\overline{C}$ without some form of intermediate stage to adjust the logic levels, unless special design steps or precautions were taken as previously discussed. Further, it can be seen that it is difficult to design the voltages of the high logic level and low logic level independently since they make use of the shared load resistors 150, 160 and are served by a common current source 140.

SUMMARY OF THE INVENTION

The invention described herein overcomes some or all of the previously mentioned shortcomings and other problems in circuits using traditional CML technology, removing the need for level conversions between successive logic stages. This is achieved by matching the output levels and succeeding input levels, using a unique technique, or gate architecture, we call Enhanced Pseudo Current Mode Logic (EPCML). The invention permits the implementation of AND, OR and XOR gates, and their corresponding (negating) equivalents NAND, NOR, NXOR. As is well known in the art, almost all more complex functions can all be constructed using various combinations of these gates.

The new EPCML gate architecture described herein can be applied to Complementary MOS (CMOS), Bipolar/CMOS (BiCMOS), and other analog or mixed analog/digital technologies today and is adaptable to future technologies as well. As mentioned earlier, this gate architecture retains the advantages of conventional circuits of this type, at the same time eliminating several of the problems associated with them, including:

1. Suitable for low voltage operation.
2. Operates in a pseudo-differential manner.
3. Provides adequate noise margins.
4. Removes the need for level conversion between logic gates, so that overall circuit speed is faster than the equivalent CML implementation.

The invention described herein therefore allows extra degrees of freedom in the design of CML gates, permitting easier matching of the logic levels of outputs and succeeding inputs, and in consequence allowing circuits to be designed and implemented which offer higher operating frequencies using the same technology when compared to those designed and implemented using other techniques.

Put simply, the invention comprises splitting the complementary logical circuit completely in half and connecting the inputs of each half (half-gate) to appropriate complementary signals. The designer is therefore able to adjust the levels of the complementary output signals independently and thereby match them to the input levels required for the immediately succeeding complementary stage. While the total number of components in the gate has increased significantly, no extra components are required to match the output of the logic stage to the input of the next (succeeding) logic stage, thereby at least partly mitigating the effects of the extra circuitry on the overall size of the circuit. Prior art implementations would require the interposing of a level conversion stage, using either active or passive components or combinations thereof. The removal of the need for the interposing stages results in an overall faster response, since, as would be understood by one skilled in the art, such extra stages must delay the signal (because of the need to propagate the signal through these extra components). These extra stages also add distortion to the signal. Thus Enhanced Pseudo Current Mode Logic (EPCML) is a practical and elegant solution that provides for circuits operating at higher frequencies than was practical previously. In short, the invention simulates the effect of traditional CML, but overcomes at least some of its disadvantages.

Although some degree of interference rejection is sacrificed in implementing this invention, this loss of interference rejection is considered a reasonable compromise in those situations where the logic is highly integrated, the gates are implemented with closely matched half-gates, and transmission paths are short and matched. At other points in a particular circuit such a compromise may not be acceptable and the designer may need to use different techniques to reduce the overall propagation times if required. Careful and intelligent design can ensure that such decisions are made consistent with optimising the overall design. For example, if the designer restricts all of the high speed components to the fully integrated environment, and only allows lower speed signals to leave that environment, propagation delays and any interfering noise will have relatively little effect.

Further, the designer must decide whether the extra size of the circuit as implemented with the invention is more important than the ability to achieve the enhanced high frequency performance.

In summary, the output high logic voltage and the output low logic voltages are established to match the input high logic voltage and the input low logic voltage respectively of a succeeding integrated logic gate subsystem. This is achieved separately for each of two symmetric complementary balanced circuits, by:

selecting a bias current value;

selecting a bias resistor value to set the output high logic voltage so that it is within the acceptance range of the succeeding input high logic voltage; and selecting input transistor parameters to set the desired output low logic voltage so that it is within the acceptance range of the succeeding input low logic voltage.

Since the voltages are independently controlled, the design of the circuit is significantly simplified when compared to other circuits providing similar complementary logic functions.

The input gates of all of the transistors are then connected to preceding logic stages so that the logical truth table implemented for the differential logic circuit is one chosen from the group consisting of: AND, NAND, OR, NOR, XOR, NXOR.

The inputs and outputs, being complementary, are largely compatible with traditional CML, provided due note is taken of the high and low logic levels, and arrangements made to match those levels with any external circuitry not taking advantage of the invention.

DESCRIPTION OF THE DRAWINGS

The invention will now be described with reference to the following figures.

DETAILED DESCRIPTION OF THE PREFERRED EMBODIMENT

The invention will now be described in terms of examples of fundamental logic gates. Note that, for the sake of clarity, in the figures and their associated descriptions, any supplementary, subsidiary, and parasitic components which are not concerned with the fundamental operation of the invention are omitted and their effects are not discussed here.

Figure 1:
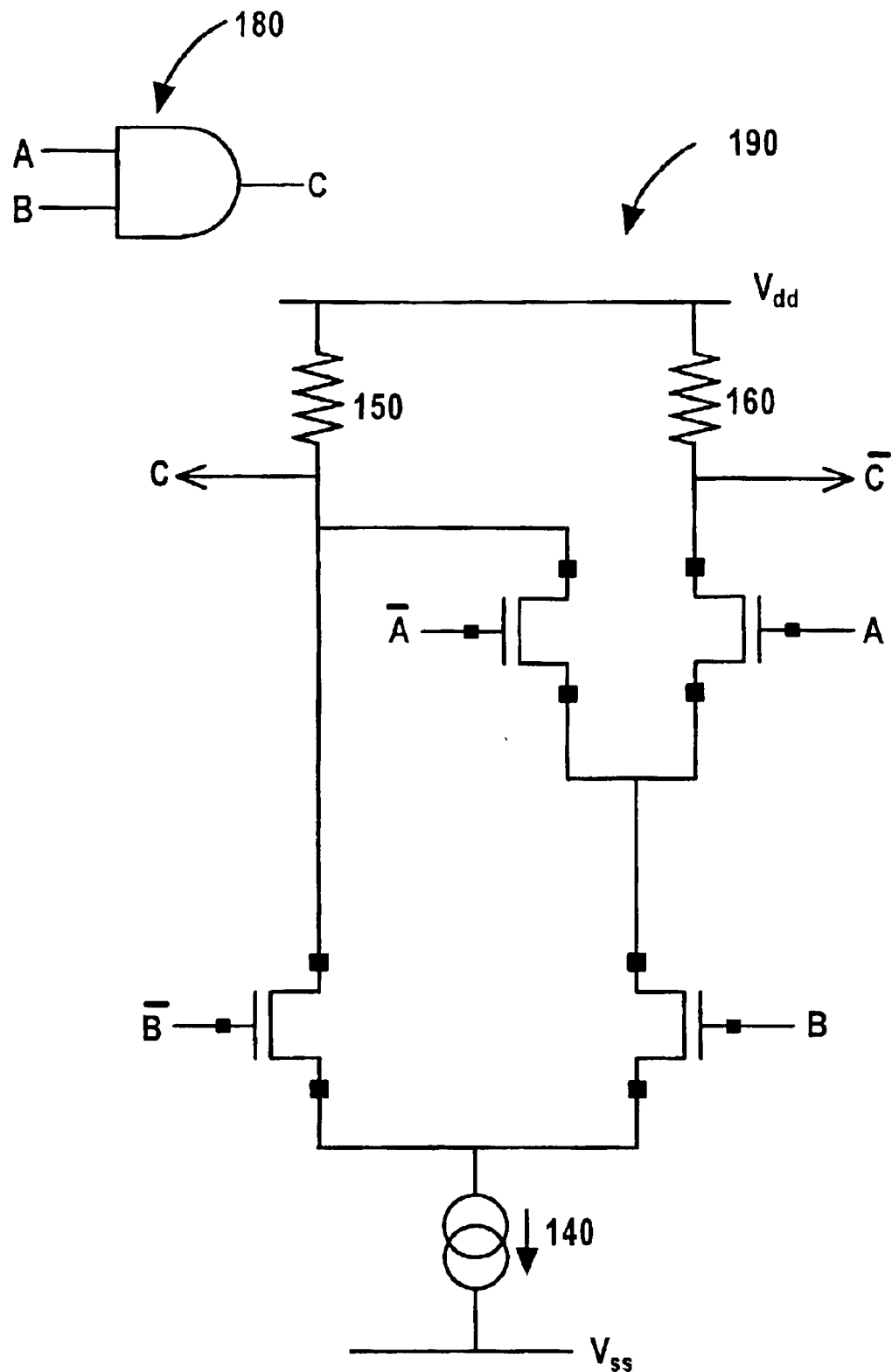
FIG. 1 is a schematic diagram of a prior art implementation of a 2-input AND gate.
Figure 2:
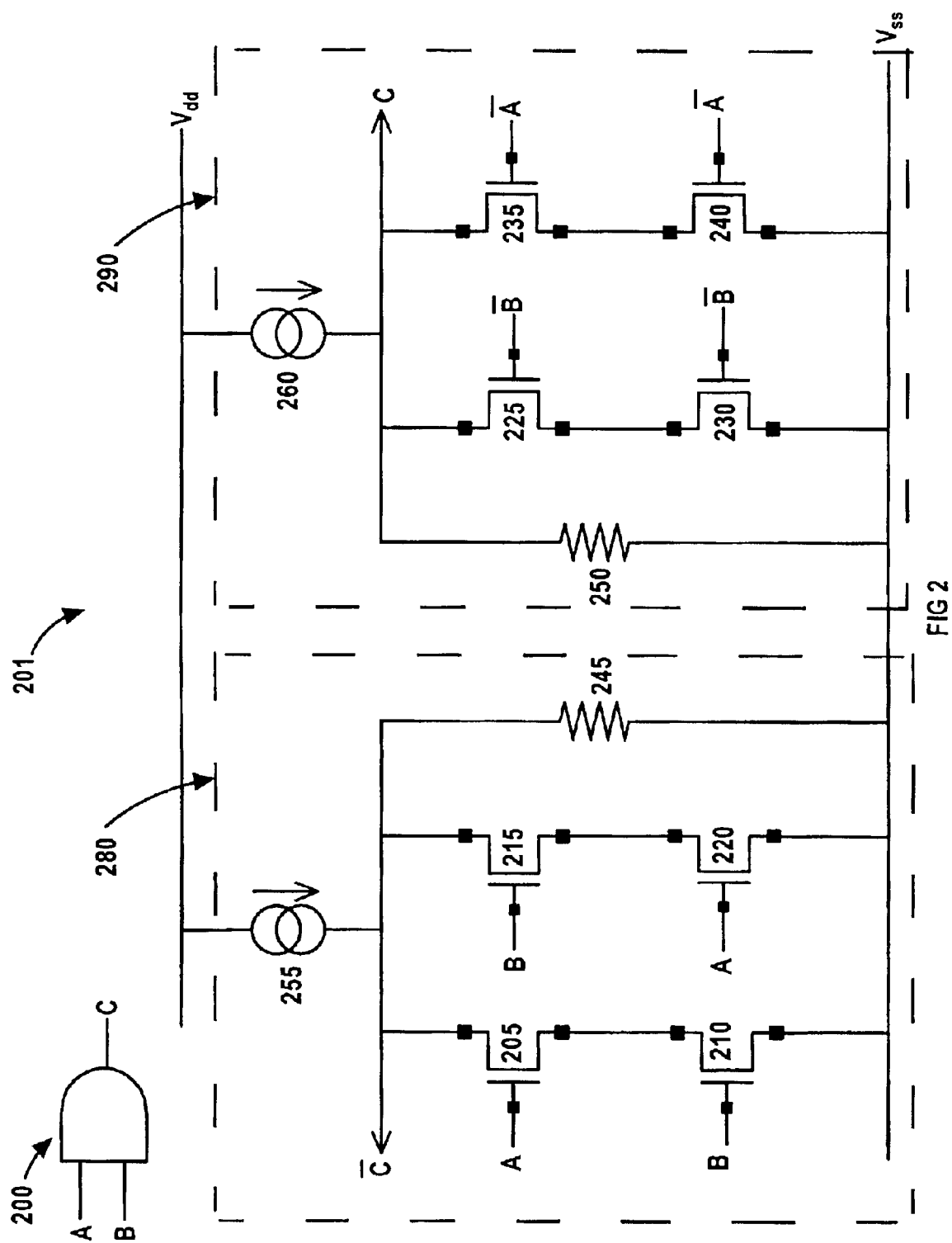
FIG. 2 is a schematic diagram of a 2-input AND gate implemented according to a preferred embodiment of the invention.

FIG. 2 presents an exemplary two-input 'AND' gate in a preferred embodiment of the invention, shown symbolically 200, and schematically 201. Here, the complementary logic gate is conveniently considered as two separate circuits (half gates), although in practice, some subsidiary or parasitic common elements may also be present. In the circuit of FIG. 2, the complementary input signals A and $\overline{A}$, and B and $\overline{B}$ have the same high logic level (H) and low logic level (L) requirements. The complementary outputs C and $\overline{C}$ can be arranged to produce these same H and L levels by careful selection of both the magnitude of the currents passed by the constant current sources 255, 260, and the value of the level setting bias resistors 245 and 250. The magnitudes of the currents and values of resistors for the two halves of the circuit are the same. In this embodiment, the input signals A and $\overline{A}$, and B and $\overline{B}$ are applied to the gates of the transistors in such a manner as to achieve the logic function required, (two-input 'AND'), and this is described later.

The symmetric halves of the circuit (half-gates) are next described in more detail, also with reference to FIG. 2. Consider first the half-gate 280 of the circuit concerned with generating the $\overline{C}$ output. The logical high level (H) for $\overline{C}$ is established by the values of the current flowing through the constant current source 255 and the level setting bias resistor 245, and can therefore be designed to match the succeeding input logic level by procedures well-understood by those skilled in the art. The logical low level (L) for $\overline{C}$ is established by the values of the current flowing through the constant current source 255 and the impedance of the transistors 205 and 210 in their ON state in series, in parallel with the impedance of the transistors 215 and 220 in their ON state, also in parallel with the level setting bias resistor 245. This level can also therefore be designed to match the succeeding input level by adjusting the parameters of the transistors 205, 210, 215, 220, again using procedures well understood by those skilled in the art.

Similar procedures can be applied to the half-gate 290 of the circuit of FIG. 2 concerned with generating the C output by appropriately adjusting the design parameters of the current source 260, resistor 250 and input transistors 225, 230, 235, 240.

Examination of the circuit of FIG. 2 shows that its operation resolves to the following truth tables (reference numerals are those of the transistors corresponding to the identified inputs):

| Input A | 205, 215 | H | H | L | L |
| Input B | 210, 220 | H | L | H | L |
| Output $\overline{C}$ | — | L | H | H | H |

| Input $\overline{A}$ | 235, 240 | L | L | H | H |
| Input $\overline{B}$ | 225, 230 | L | H | L | H |
| Output C | — | H | L | L | L |

The circuit of FIG. 2 also lends itself to a very straightforward algebraic analysis:

$$\overline{C} = \text{inverse of } (A \text{ AND } B \text{ OR } B \text{ AND } A)$$

$$= \text{inverse of } (A \text{ AND } B)$$

$$C = \text{inverse of } (\overline{B} \text{ AND } \overline{B} \text{ OR } \overline{A} \text{ AND } \overline{A})$$

$$= \text{inverse of } (\overline{B} \text{ OR } \overline{A})$$

$$= A \text{ AND } B$$

Both of which are correct.

Figure 3:
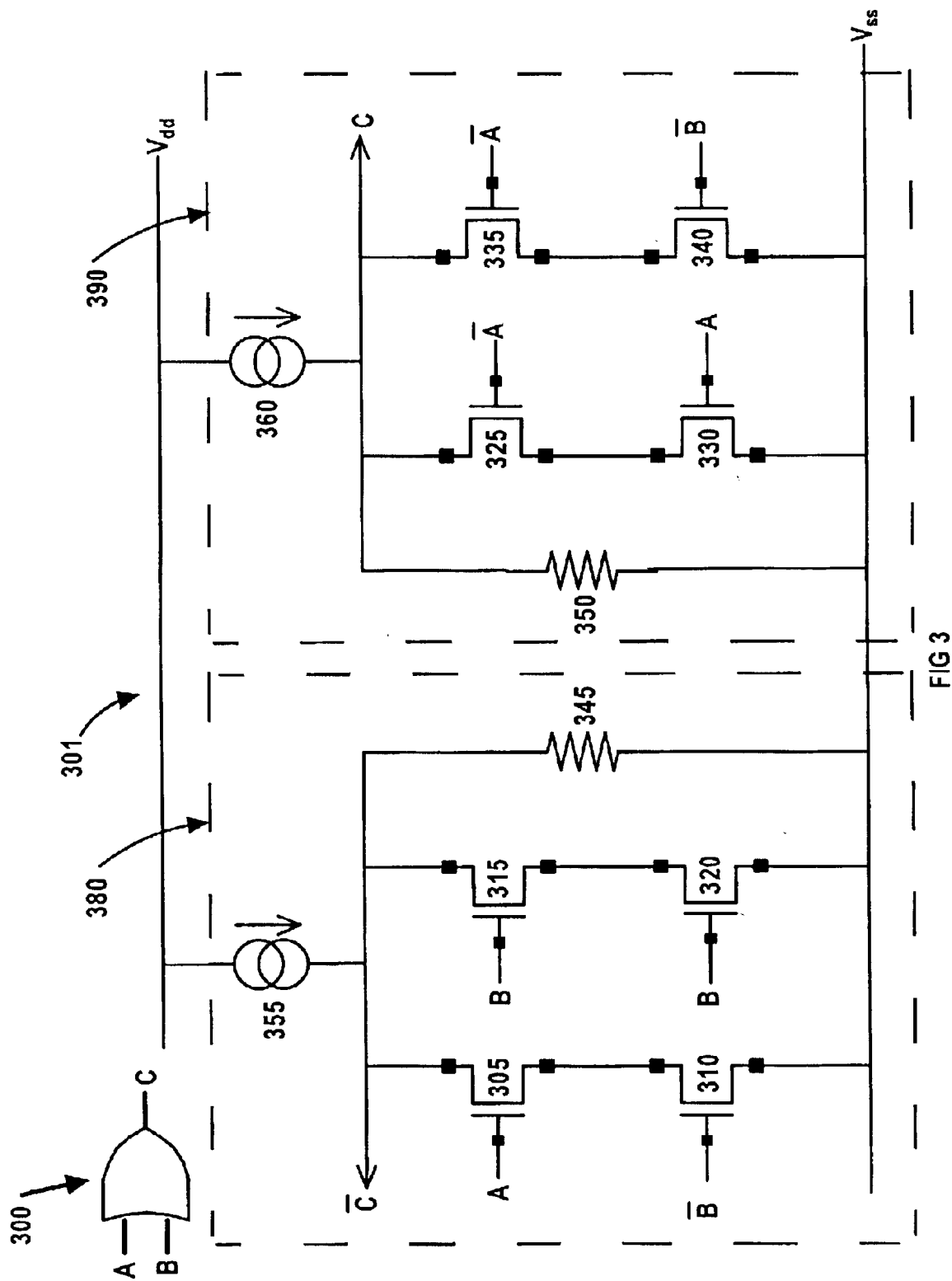
FIG. 3 is a schematic diagram of a 2-input OR gate implemented according to a preferred embodiment of the invention.
Figure 4:
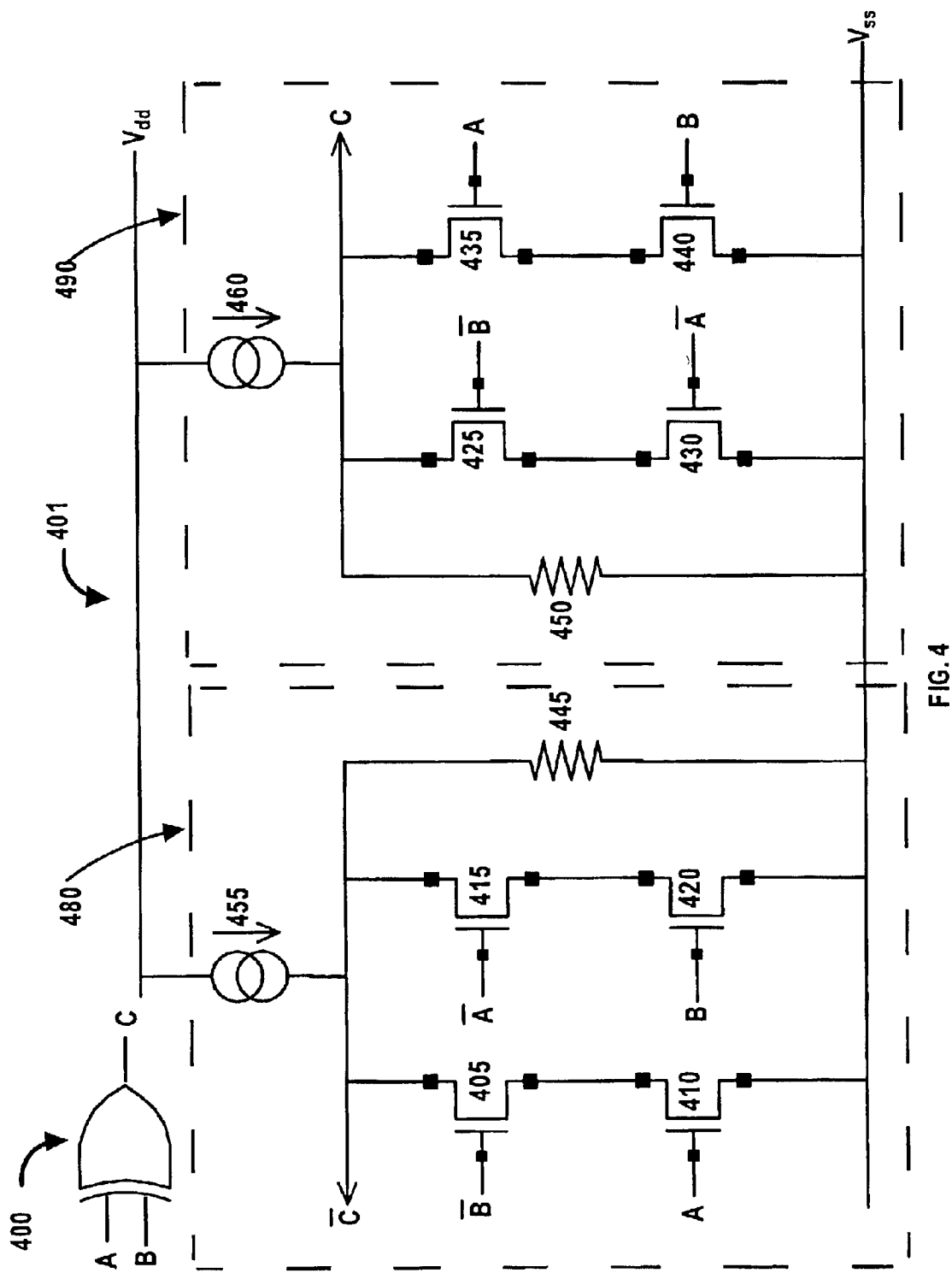
FIG. 4 is a schematic diagram of a 2-input XOR gate implemented according to a preferred embodiment of the invention.

FIGS. 3 and 4 show further embodiments of the invention, for two-input 'OR' and two-input 'XOR' gates respectively, which are described in more detail below. In both cases, it is interesting to note that the circuitry to implement the gate is the same as for the 'AND' gate of FIG. 2, and that the function is varied by the particular interconnection of the inputs with the preceding logic.

In a second example, using a preferred embodiment of the invention, as illustrated in FIG. 3, a two-input 'OR' gate, shown symbolically 300, and schematically 301, is implemented. Again, the complementary logic gate is conveniently considered as two separate circuits or half-gates 380, 390, although in practice, some ancillary common elements may also be present. Similar design steps and decisions to those used in FIG. 2 ensure that appropriate H and L logic levels are provided by the outputs C and C. The logic high levels H are set by selection of the constant current sources 355, 360 and associated resistors 345, 350, and the logic low levels L by the parameters of the various input transistors 305, 310, 315, 320, 325, 330, 335, 340.

Examination of the circuit of FIG. 3 shows that its operation resolves to the following truth tables (reference numerals are those of the transistors corresponding to the identified inputs):

| Input A | 305 | H | H | L | L |
|---|---|---|---|---|---|
| Input B | 315, 320 | H | L | H | L |
| Input $\overline{B}$ | 310 | L | H | L | H |
| Output $\overline{C}$ | — | L | L | L | H |

| Input A | 330 | H | H | L | L |
|---|---|---|---|---|---|
| Input $\overline{A}$ | 325, 335 | L | L | H | H |
| Input $\overline{B}$ | 340 | L | H | L | H |
| Output C | — | H | H | H | L |

In a third example, using yet another preferred embodiment of the invention, as illustrated in FIG. 4, a two-input 'XOR' gate, shown symbolically 400, and schematically 401, is implemented. As before, the complementary logic gate is conveniently considered as two separate circuits or half-gates 480, 490, although in practice, some ancillary common elements may also be present. Similar design steps to those used in FIG. 2 ensure that appropriate H and L logic levels are provided by the outputs C and $\overline{C}$. Again the logic high levels are set by selection of the constant current sources 455, 460 and associated resistors 445, 450, and the logic low levels by the parameters of the various input transistors 405, 410, 415, 420, 425, 430, 435, 440.

Examination of the circuit of FIG. 4 shows that its operation resolves to the following truth tables (reference numerals are those of the transistors corresponding to the identified inputs):

| Input $\underline{A}$ | 410 | H | H | L | L |
|---|---|---|---|---|---|
| Input $\overline{A}$ | 415 | L | L | H | H |
| Input B | 420 | H | L | H | L |
| Input $\overline{B}$ | 405 | L | H | L | H |
| Output $\overline{C}$ | — | H | L | L | H |

| Input A | 435 | H | H | L | L |
|---|---|---|---|---|---|
| Input $\overline{A}$ | 430 | L | L | H | H |
| Input B | 440 | H | L | H | L |
| Input $\overline{B}$ | 425 | L | H | L | H |
| Output C | | L | H | H | L |

Figure 5:
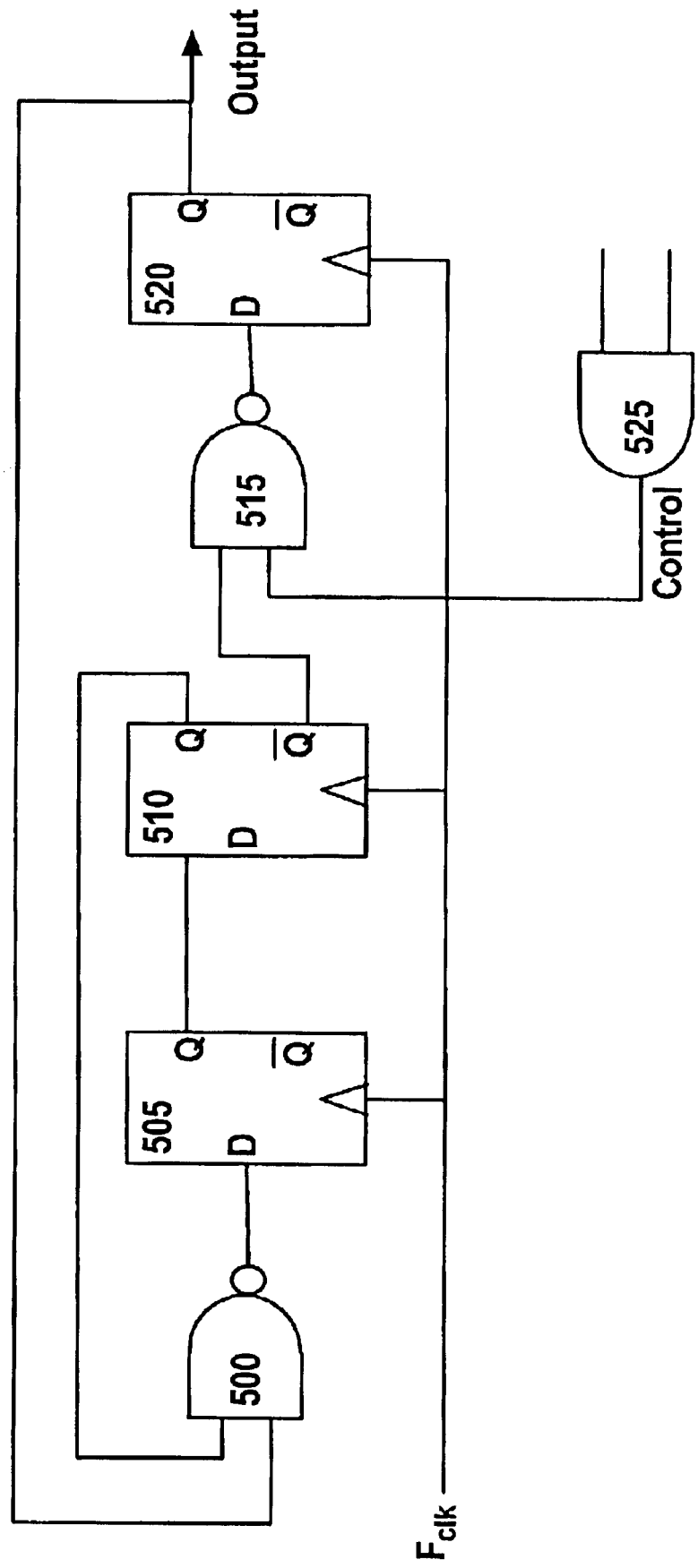
FIG. 5 shows a simple example of a subsystem wherein the invention may be used.

For illustrative purposes the invention has been implemented a's part of a divide by 4/5 prescaler which is illustrated in FIG. 5. The various NAND, 500, 515, and other logic functions such as AND, 525, and any external combinational EPCML logic using AND, OR, and XOR gates, are all designed to have their output levels match the input levels required for the succeeding stages. The design of the D-type flip-flops 505, 510, 520 ensures that the input and output high logic (H) and low logic (L) levels match those of the connected EPCML AND, OR and XOR gates. The elimination of the level-shifters increases the maximum frequency of the input signal capable of being serviced by the circuit. For this example, simulations have shown that the circuit can be operated with an input frequency exceeding 8 GHz.

Because the physical structure of all three gates (AND, OR and XOR) is the same, the function of a gate being determined by the assignment of the inputs, replication of the structure can simplify the overall layout and optimisation of a complete logic device or system.

Those skilled in the art will recognise that AND and NAND gates of the invention have the same design and logic, since the connection of the complementary outputs to succeeding stages need only to be exchanged to achieve the appropriate logical negation function. This is true also of the OR, NOR and XOR, NXOR function pairs.

The assignment of preceding outputs to the inputs of the various gates to produce the logic elements used in the examples is not intended to limit the possibility of varying this assignment. We intend that this application cover all reasonable assignments, and that the invention be not limited by the examples given. Note, for example, that a three input AND gate could be implemented using three switching paths on each side of the EPCML circuit, each signal path employing three semiconductors. The algebra of the inputs to the outputs is very simple and would be clear to one skilled in the art.

Although the present invention has been described in considerable detail with reference to certain preferred embodiments thereof, other versions are possible. Therefore, the spirit and scope of the appended claims should not be limited to the description of the preferred embodiments contained herein.

What is claimed is:

1. An integrated circuit gate architecture for use in balanced complementary RF logic applications comprising a gate split into two indenendent complementary logic stages or half-gates, a first logic stage providing an output and a second logic stage providing a complement of said output of said first stage, said two logic stages having independent means for adjusting the logic high levels of said complementary outputs and independent means for adjusting the logic low levels of said complementary outputs substantially independent of said logic high levels.

2. The integrated logic architecture of claim 1 wherein:
said independent means to adjust the logic high level of said complementary output signals comprising in each stage a constant current source and a level setting bias resistor arranged in series; and said independent means to adjust the logic low level of said complementary output signals substantially independent of said logic high levels comprises in each stage said constant current source and a number of transistors arranged in series with said constant current source, said transistors being designed to provide a low impedance when the gates of said transistors are biased appropriately by complementary input signals.

3. The integrated logic architecture as described in claim 2 wherein the function provided for at least two complementary input signal pairs is one chosen from the group consisting of: AND, NAND, OR, NOR, XOR, NXOR.

4. An integrated circuit architecture for a logic gate comprising:
   first means for biasing a first output to a high logic level;
   switching means for providing a low impedance path between said first output and Vss in response to a predetermined logic state, capable of biasing said first output to a low logic level substantially independent of the logic high level of said first output;
   second means for biasing a second output to a high logic level; and
   switching means for providing a low impedance path between said second output and Vss in response to a complementary predetermined logic state, capable of biasing said second output to a low logic level substantially independent of the logic high level of said second output.

5. An integrated circuit architecture for a differential logic gate comprising:
   a first circuit having:
   a first constant current source feeding a first output;
   first level setting bias resistor between said first output and Vss; and
   at least two semiconductor switching paths, in parallel with said first level setting bias resistor, each capable of providing a low impedance path between said first output and Vss in response to a predetermined logic state; and
   a second circuit for generating a complementary signal to said first circuit, said second circuit having:
      a second constant current source feeding a second output;
      a second level setting bias resistor between said second output and Vss; and
      at least two semiconductor switching paths, in parallel with said second level setting bias resistor, each capable of providing a low impedance path between said second output and Vss in response to a complementary predetermined logic state.

6. An integrated circuit architecture for a differential logic gate comprising:
   a first circuit having:
      a first constant current source feeding a first output;
      a first level setting bias resistor between said first output and Vss; and
      first and second semiconductor switching paths, in parallel with said first level setting bias resistor, each capable of providing a low impedance path between said first output and Vss in response to a predetermined logic state; and
   a second circuit for generating a complementary signal to said first circuit, said second circuit having:
      a second constant current source feeding a second output;
      a second level setting bias resistor between said second output and Vss; and
      third and fourth semiconductor switching paths, in parallel with said second level setting bias resistor, each capable of providing a low impedance path between said second output and Vss in response to a complementary predetermined logic state.

7. A logic component configuration providing a differential logic circuit having a high bandwidth and adequate noise tolerance, and capable of being used in complex circuits requiring low propagation delay, said differential circuit comprising:
   a first input circuit receiving inputs, the sources of the lower transistors connected to Vss, the drains connected to a first output;
   a first level setting bias load resistor, one end connected to Vss, the other connected to said first output;
   a first constant current source operatively coupled between Vdd and said first output;
   a second input circuit receiving inputs, the sources of the lower transistors connected to Vss, the drains connected to a second output;
   a second level setting bias resistor, one end connected to Vss the other connected to said second output; and
   a second constant current source operatively coupled between Vdd and said second output,
   input signals to the input gates of said first and second input circuits comprising complementary logic signals, and said outputs being arranged to be complementary logic output signals.

8. The differential logic circuit of claim 7 wherein
   said first input circuit comprises:
      a first path comprising two transistors in series; and
      a second path comprising two transistors in series;
      the first and second paths being connected in parallel; and
   said second input circuit comprises:
      a third path comprising two transistors in series; and
      a fourth path comprising two transistors in series;
      the third and fourth paths being connected in parallel;
   thereby permitting various suitable combinations of complementary inputs to be applied to the circuit.

9. A method for the design of Integrated differential circuit logic gate subsystems for use in balanced complementary RF logic applications wherein the output high logic voltage and the output low logic voltages are established to match the input high logic voltage and the input low logic voltage respectively of a succeeding integrated logic gate subsystem, comprising the steps of, for each of two symmetric complementary balanced circuits or half-gates,
   selecting a bias current value;
   selecting a level setting bias resistor value to set the output high logic voltage to that required by inputs of succeeding logic stages; and
   selecting input transistor parameters to set the desired output low logic voltage to that required by inputs of succeeding logic stages.

10. A computer readable memory medium, storing computer software code in a hardware development language for fabrication of an integrated circuit comprising a logic component configuration providing a differential logic circuit having a high bandwidth and adequate noise tolerance, and capable of being used in complex circuits requiring low propagation delay, said differential circuit comprising:
   a first input circuit receiving inputs, the sources of the lower transistors connected to Vss, the drains connected to a first output;

a first level setting bias resistor, one end connected to Vss, the other connected to said first output;

a first constant current source operatively coupled between Vdd and said first output;

a second input circuit receiving inputs, the sources of the lower transistors connected to Vss, the drains connected to a second output;

a second level setting bias resistor, one end connected to Vss the other connected to said second output; and a second constant current source operatively coupled between Vdd and said second output, input signals to the input gates of said first and second input circuits comprising complementary logic signals, and said outputs being arranged to be complementary logic output signals.

11. The computer readable memory medium of claim 10, wherein:

said first input circuit comprises:
a first path comprising two transistors in series; and
a second path comprising two transistors in series;

said first and second paths being connected in parallel; and said second input circuit comprises:
a third path comprising two transistors in series; and
a fourth path comprising two transistors in series;

said third and fourth paths being connected in parallel; thereby permitting various suitable combinations of inputs to be applied to the circuit.

12. A computer data signal embodied in a carrier wave, said computer data signal comprising computer software code in a hardware development language for fabrication of an integrated circuit comprising a logic component configuration providing a differential logic circuit having a high bandwidth and adequate noise tolerance, and capable of being used in complex circuits requiring low propagation delay, said differential circuit comprising:

a first input circuit receiving inputs, the sources of the lower transistors connected to Vss, the drains connected to a first output;

a first level setting bias resistor, one end connected to Vss, the other connected to said first output;

a first constant current source operatively coupled between Vdd and said first output;

a second input circuit receiving inputs, the sources of the lower transistors connected to Vss, the drains connected to a second output;

a second level setting bias resistor, one end connected to Vss the other connected to said second output; and a second constant current source operatively coupled between Vdd and said second output, input signals to the input gates of said first and second input circuits comprising complementary logic signals, and said outputs being arranged to be complementary logic output signals.

13. The computer data signal of claim 12, wherein:

said first input circuit comprises:
a first path comprising two transistors in series; and
a second path comprising two transistors in series;

said first and second paths being connected in parallel; and said second input circuit comprises:
a third path comprising two transistors in series; and
a fourth path comprising two transistors in series;

said third and fourth paths being connected in parallel; thereby permitting various suitable combinations of inputs to be applied to the circuit.

* * * * *